March 15, 1966 R. L. MARTIN ETAL 3,240,684

METHOD OF ETCHING RHODIUM PLATED METAL LAYERS AND OF MAKING RHODIUM PLATED PRINTED CIRCUIT BOARDS

Filed Feb. 21, 1962

INVENTORS
ROSS L. MARTIN
BY CHARLES J. WILLIAMS

Benjamin J. Barish
ATTORNEY 3,240,684

METHOD OF ETCHING RHODIUM PLATED METAL LAYERS AND OF MAKING RHODIUM PLATED PRINTED CIRCUIT BOARDS

Ross L. Martin and Charles J. Williams, Detroit, Mich., assignors to Burroughs Corporation, Detroit, Mich., a corporation of Michigan Filed Feb. 21, 1962, Ser. No. 174,905
14 Claims. (Cl. 204—15)

Figure 1:
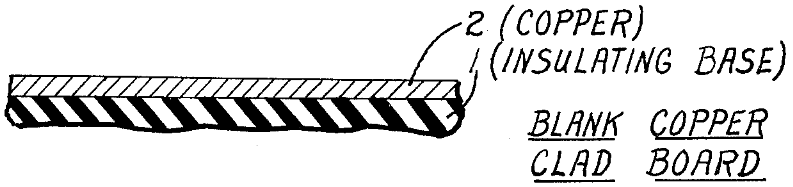

The present invention relates to a method of etching rhodium plated metal or conductive layers, and also to a method of making rhodium plated printed circuit boards.

Rhodium plated circuit boards are commonly used as switch plates and commutator disks because they provide excellent switch and commutator contact surface and excellent corrosion resistance. Such boards typically include an insulating base, a layer of copper, an electroplated layer of nickel, and an electroplated layer of rhodium.

A number of procedures have been devised for producing such boards:

In one procedure, a copper clad board is coated with a photosensitive resist and photographed with a photographic negative. That is, the photograph is a negative representation of the desired conductive pattern and exposes to the light those areas of the resist which cover the desired conductive pattern. The resist is developed and the light-exposed portions thereof are removed. The board is then electroplated with successive layers of copper, nickel and rhodium, and is again coated with a resist and photographed with a photographic positive. The resist is developed, and the light-exposed areas thereof, i.e., those areas not covering the desired conductive pattern, are removed. The latter areas are then etched leaving the desired rhodium-plated conductive pattern covered by the resist, whereupon the resist is washed off.

Disadvantages of this procedure include the difficulty in perfectly lining up the positive image with the circuit, and the relatively large number of steps required because of the double exposure procedure to form the desired printed circuit pattern. Because of these difficulties and extra steps, this procedure is quite costly and generally results in a high scrap rate.

Another technique uses the rhodium coating as a resist. In this method, as in the previously described one, the copper clad board is masked with a resist to leave the circuit portion exposed; the board is electroplated with successive coatings of copper, nickel and rhodium; and the resist is removed from the noncircuit portions of the board, leaving the rhodium plating covering the circuit portions. Here, however, the board is then subjected to an etchant which does not attack the rhodium but etches away the copper cladding not covered by the rhodium.

This procedure, while somewhat simpler, requires that the rhodium plating solution be virtually free of contamination. If there is any contaminant, as by the drag-in of nickel plating solution into the rhodium bath, then when the board is etched by the ferric chloride, pinholes and pits will be produced in the rhodium plating. This not only results in a high scrap rate, but also requires that the complete rhodium solution be replaced each time this occurs, which is exceedingly costly.

In another technique frequently used in producing rhodium plated boards, a copper clad board is coated with resist to cover the desired circuit pattern and also to cover spaces between the elements of the pattern, to form connecting bars interconnecting each portion of the circuit. The board is etched to leave the desired circuit and connecting bars, and the resist is removed. The board is then electroplated with successive coatings of copper, nickel and rhodium, the connecting bars producing electrical continuity for these electroplating steps. After plating, the connecting bars are removed, as by milling.

The disadvantages of this process, however, include the fact that the milling operation for removing the temporary connecting bars is an extra step involving an extra cost. Also, it tends to tear the edges of the circuit pattern, and sometimes embeds the edges of the copper into the insulating board such that portions of the circuit are shorted out. Because of these disadvantages, this process is usually not used on complicated boards.

A broad object of the invention is to provide an improved method of etching rhodium plated metal or conductive layers.

A further object of the invention is to provide a new process for making rhodium plated printed circuit boards which avoids many of the disadvantages and drawbacks discussed above characteristic of the previously known processes.

A further object of the invention is to provide an improved method of making rhodium plated printed circuit boards which is efficient, reliable and relatively inexpensive, and which lends to high volume production and also to producing relatively complicated boards.

According to a broad aspect of the invention, there is applied to the surface of a rhodium plated metal or conductive layer to be etched, a coating or film of a metal selected from the group consisting of cadmium, zinc, tin and copper. A resist material is applied over this coating to mask those areas desired to be retained and to expose those areas desired to be removed. The metal layer completely underlies the masking resist material and promotes the adherence of the resist material to the rhodium plating. The article is then subject to an etchant which removes the areas exposed by the masking material. Following the etching, the resist and metal coatings are removed.

According to a preferred embodiment of the invention, a printed circuit board, comprising an insulating base, a conductive layer, and a layer of rhodium thereover, is plated with a coating or layer of a metal selected from the group consisting of cadmium, zinc, tin and copper. A photosensitive resist material is then applied. The coating or layer of the metal completely underlies the resist material and promotes the adherence of that material to the rhodium plating. The resist is then exposed through a photographic positive of the desired printed circuit pattern. The portions of the resist overlying the printed circuit portions desired to be removed are then removed, and the metal and underlying rhodium and conductive layers exposed by the removal of the resist are then removed by subjecting the board to a chemical etchant. The remaining resist and underlying metal (i.e. the cadmium, zinc, tin or copper) are then removed to leave the desired conductive pattern coated with the rhodium plating.

The invention will be better understood by the following description of a process for making a rhodium plated printed circuit contact board, which is described herein as a preferred embodiment of the invention.

In the drawings, FIGS. 1–7 illustrate the salient steps involved in the process for making a rhodium plated printed circuit board in accordance with the present invention.

FIG. 1 illustrates the blank copper clad board which serves as a substrate for performing the sequence of steps to produce the rhodium plated board. The insulating base 1 is preferably of glass impregnated with a phenolic resin, and the copper cladding 2 is preferably an electrolytic copper foil bonded to the base 1 by an adhesive and/or by pressure.

The board is immersed in an alkaline bath for cleaning purposes, rinsed, and then may be immersed in a copper plating bath to apply a very thin layer, or flash, of copper (not shown) over the copper foil 2 for promoting the adherence of the subsequent coatings. A suitable copper bath may comprise:

| | Ounces per gallon |
|---|---|
| Copper cyanide | 3 |
| Sodium cyanide | 4.5 |
| Free sodium cyanide | 2.0 |
| Sodium hydroxide | 0.5 |

Figure 2:
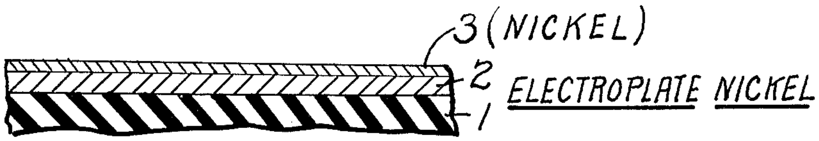
Figure 3:
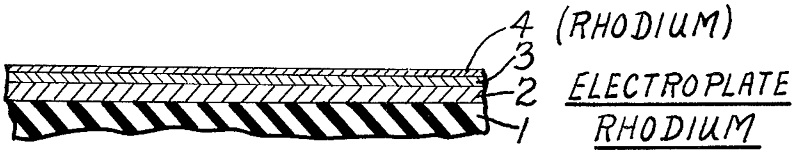
Figure 4:
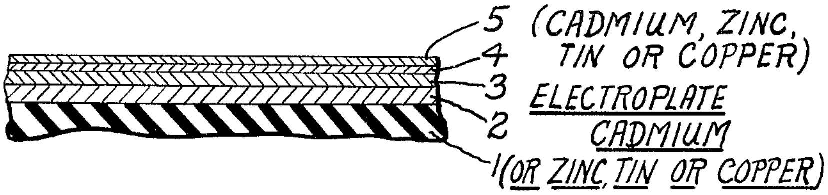

FIG. 2 illustrates the next salient step in the process, namely the plating of a nickel coating on the copper. This step is also performed by electroplating, a suitable nickel plating bath comprising:

| | Ounces per gallon |
|---|---|
| Nickel chloride | 7.5 |
| Nickel sulfate | 35.0 |
| Boric acid | 6.3 |

The pH of the bath is adjusted to be about 4.6. This bath deposits a nickel coating of 0.0002 to 0.0004 inch.

The complete board is then immersed in an electroplating bath for applying a plating of rhodium 4 (FIG. 3) of 0.000025 to 0.000040 inch. A suitable rhodium plating bath comprises:

| | | |
|---|---|---|
| Rhodium metal | grams per gallon | 18 |
| Sulphuric acid | ml. per gallon | 110 |

Next, a very thin layer, or flash, of cadmium, zinc, tin or copper (FIG. 4) is electroplated on the rhodium. A suitable cadmium plating bath may comprise:

| | Ounces per gallon |
|---|---|
| Cadmium metal | 2.5 |
| Sodium cyanide | 16.0 |
| Sodium hydroxide | 0.85 |

A suitable zinc bath may comprise:

| | Ounces per gallon |
|---|---|
| Zinc cyanide | 10.6 |
| Sodium cyanide | 5 |
| Sodium hydroxide | 15 |

A suitable tin bath may comprise:

| | Ounces per gallon |
|---|---|
| Tin metal | 10.8 |
| Stannous fluoborate | 26.8 |
| Free boric acid | 6.7 |

The copper bath could be the same one set forth above for electroplating a thin layer of copper over copper foil 2 for promoting the adherence of the subsequent coatings.

While the invention contemplates the use of cadmium, zinc, tin or copper for this coating, particularly good results have been produced by the use of the cadmium coating, and therefore cadmium is preferred. Whichever metal is selected, the coating is very thin, in the order of 0.000050 inch.

Next, a photosensitive coating is applied as by spraying or dipping. A suitable photosensitive coating is one supplied under the trademark KPR by Eastman Kodak Company, of Rochester, New York. This material is an organic solvent solution of a photosensitive plastic, and is sensitive to ultraviolet light.

Figure 5:
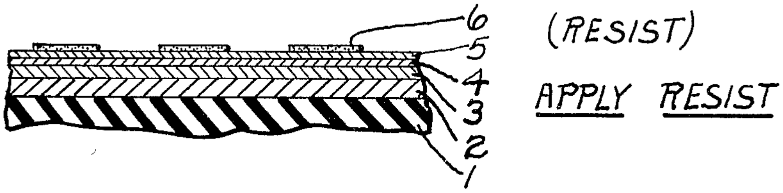

The coated board is exposed through a photographic positive of the desired printed circuit pattern. A 15 amp. arc light is used for about three minutes at a distance of about two feet, and the exposed plate is developed in trichlorethylene vapor. This may be done by using a gentle spray followed by immersion in the vapors. The vapor dip is repeated sufficiently to remove all of the unwanted resist from the portions of the coating exposed to the light source. FIG. 5 illustrates the board at this stage of the process.

Figure 6:
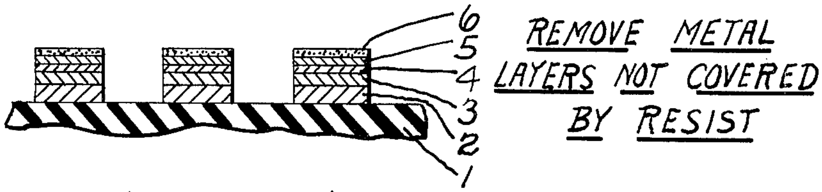
Figure 7:
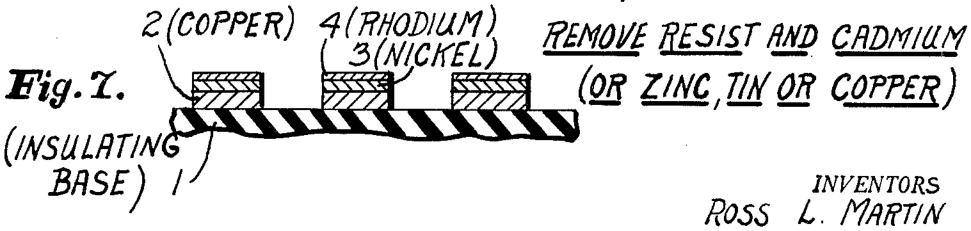

The printed circuit board is then dipped in an etchant, a suitable bath being an aqueous solution of approximately 30 percent ferric chloride. The etchant removes the metal layers exposed by the removed resist, leaving the metals in accordance with the desired circuit pattern covered by the retained resist (FIG. 6).

The resist is then removed by the use of methyl ethyl ketone, leaving the rhodium plated pattern still covered with a thin coating of cadmium, zinc, tin or copper, whichever of these metals was selected in the process as described above. This metal is then removed (FIG. 7) by a suitable solvent applied for a sufficient time so as not to attack the rhodium plating. If cadmium or zinc were used, it could be removed by ammonium nitrate, and if tin or copper were used, it could be removed by ammonium persulfate solution in water, a suitable solution comprising two pounds of ammonium persulfate per gallon of water.

Excellent results have been produced by the above described process. The cadmium, zinc, tin or copper layer, whichever is used, has been found to promote a very strong bond between the rhodium and the photosensitive resist so that no pinholes or pits are formed in the rhodium plating after the etching step. This process also obviates the need of the double photographing steps, and the step of removing temporary connecting bars, characteristic of certain earlier procedures for making rhodium plated boards. In addition, in this technique the rhodium plating is not used as the resist, and therefore there is not as great a need for virtual 100 percent purity of the rhodium plating bath and as great a danger of spoiling the rhodium plating bath, as in another one of the above-described earlier techniques.

It is to be understood that the above description sets forth, for simplification purposes, only the salient steps and reagents in producing a rhodium plated board. Many other conventional steps well known in the printed circuit art would be used, for example washing the board after each successive electroplated coating. Also, the various baths could include other reagents, or modifiers, for example proprietary brighteners. It will also be appreciated that the process, insofar as disclosed above, would produce a raised circuit pattern. However, the circuitry could be made flush with the surface of the board, by heat and pressure, as is frequently done in making rhodium plated switch plates and commutator disks.

While the invention has been described with respect to the production of rhodium plated switch plates and commutator disks, it will be appreciated that it may also be used in other applications, and that many other variations and modifications of the invention could be made still coming within the spirit and scope of the invention as defined in the following claims.

We claim:

1. A method of etching a rhodium plated conductive layer comprising: applying a layer of a metal selected from the group consisting of cadmium, zinc, tin and copper over the rhodium plated conductive layer; applying a masking material to the portions of said layer of metal overlying the area of the rhodium plated conductive layer to be retained; said metal layer completely underlying said masking material and promoting the adherence thereof to the rhodium plating; and removing the said metal layer and the underlying rhodium plating and conductive layer exposed by said masking material by subjecting same to a chemical etchant.

2. The method as defined in claim 1 wherein said metal is cadmium.

3. The method as defined in claim 1 wherein said metal is zinc.

4. The method as defined in claim 1 wherein said metal is tin.

5. The method as defined in claim 1 wherein said metal is copper.

6. A method of making a printed circuit board, comprising: applying a conductive layer over an insulating base; applying a layer of rhodium over said conductive layer; applying a layer of a metal selected from the group consisting of cadmium, zinc, tin and copper over the rhodium; coating said layer of metal with a photosensitive resist; said metal layer completely underlying said photosensitive resist and promoting the adherence thereof to the rhodium layer; exposing said photosensitive resist in accordance with the desired printed circuit pattern; removing the portions of said resist overlying the printed circuit portions desired to be removed; and removing the said metal and the underlying rhodium and conductive layers exposed by the removal of the resist by subjecting the board to a chemical etchant for said conductive and metal layers.

7. A method of making a printed circuit board, comprising: applying a conductive layer over an insulating base; applying a layer of rhodium over said conductive layer; applying a layer of a metal selected from the group consisting of cadmium, zinc, tin and copper over the rhodium; coating said layer of metal with a photosensitive resist; said metal layer completely underlying said photosensitive resist and promoting the adherence thereof to the rhodium layer; exposing said photosensitive resist in accordance with the desired printed circuit pattern; removing the portions of said resist overlying the printed circuit portions desired to be removed; removing the said metal and the underlying rhodium and conductive layers exposed by the removal of the resist by subjecting the board to a chemical etchant for said conductive and metal layers; and removing the remainder of said resist coating and the said metal overlying said rhodium and underlying the remainder of said resist coating.

8. A method of making a printed circuit board, comprising: applying a copper layer over an insulating base; electroplating a layer of nickel over said copper layer; electroplating a layer of rhodium over said nickel layer; electroplating a film of cadmium over the rhodium layer; coating said cadmium film with a photosensitive resist; said cadmium film completely underlying said photosensitive resist and promoting the adherence thereof to the rhodium layer; exposing said photosensitive resist in accordance with the desired printed circuit pattern; removing the portions of said resist overlying the printed circuit portions desired to be removed; removing said cadmium film and the underlying rhodium, nickel and copper layers exposed by the removal of the resist by subjecting the board to a ferric chloride solution; removing the remainder of said resist coating; and treating the board with ammonium nitrate to remove the cadmium film underlying the remainder of said resist coating.

9. A method of making a printed circuit board, comprising: applying a copper layer over an insulating base; electroplating a layer of nickel over said copper layer; electroplating a layer of rhodium over said nickel layer; electroplating a film of zinc over the rhodium layer; coating said zinc film with a photosensitive resist; said zinc film completely underlying said photosensitive resist and promoting the adherence thereof to the rhodium layer; exposing said photosensitive resist in accordance with the desired printed circuit pattern; removing the portions of said resist overlying the printed circuit portions desired to be removed; removing said zinc film and the underlying rhodium, nickel and copper layers exposed by the removal of the resist by subjecting the board to a ferric chloride solution; removing the remainder of said resist coating; and treating the board with ammonium nitrate to remove the zinc film underlying the remainder of said resist coating.

10. A method of making a printed circuit board, comprising: applying a copper layer over an insulating base; electroplating a layer of nickel over said copper layer; electroplating a layer of rhodium over said nickel layer; electroplating a film of tin over the rhodium layer; said tin film completely underlying said photosensitive resist and promoting the adherence thereof to the rhodium layer; coating said tin film with a photosensitive resist; exposing said photosensitive resist in accordance with the desired printed circuit pattern; removing the portions of said resist overlying the printed circuit portions desired to be removed; removing said tin film and the underlying rhodium, nickel and copper layers exposed by the removal of the resist by subjecting the board to a ferric chloride solution; removing the remainder of said resist coating; and treating the board with ammonium persulfate to remove the tin film underlying the remainder of said resist coating.

11. A method of making a printed circuit board, comprising: applying a copper layer over an insulating base; electroplating a layer of nickel over said copper layer; electroplating a layer of rhodium over said nickel layer; said copper film completely underlying said photosensitive resist and promoting the adherence thereof to the rhodium layer; electroplating a thin film of copper over the rhodium layer; coating said thin film of copper with a photosensitive resist; exposing said photosensitive resist in accordance with the desired printed circuit pattern; removing the portions of said resist overlying the printed circuit portions desired to be removed; removing said thin copper film and the underlying rhodium, nickel and copper layers exposed by the removal of the resist by subjecting the board to a ferric chloride solution; removing the remainder of said resist coating; and treating the board with ammonium nitrate to remove the copper film underlying the remainder of said resist coating.

12. A method of making a printed circuit board, comprising: applying a copper layer over an insulating base; electroplating a layer of nickel over said copper layer; electroplating a layer of rhodium over said nickel layer; electroplating a layer of a metal selected from the group consisting of cadmium, zinc, tin and copper over the rhodium layer; coating said layer of metal with a photosensitive resist; said metal layer completely underlying said photosensitive resist and promoting the adherence thereof to the rhodium layer; exposing said photosensitive resist in accordance with the desired printed circuit pattern; removing the portions of said resist overlying the printed circuit portions desired to be removed; and removing the said metal and the underlying rhodium, nickel and copper layers exposed by the removal of the resist by subjecting the board to a chemical etchant for said metal layers.

13. A method of making a printed circuit board, comprising: applying a copper layer over an insulating base; electroplating a layer of nickel over said copper layer; electroplating a layer of rhodium over said nickel layer; electroplating a layer of a metal selected from the group consisting of cadmium, zinc, tin and copper over the rhodium layer; coating said layer of metal with a photosensitive resist; said metal layer completely underlying said photosensitive resist and promoting the adherence thereof to the rhodium layer; exposing said photosensitive resist in accordance with the desired printed circuit pattern; removing the portions of said resist overlying the printed circuit portions desired to be removed; removing the said metal and the underlying rhodium, nickel and copper layers exposed by the removal of the resist by subjecting the board to a chemical etchant for said metal layers; and removing the remainder of said resist coating and the said metal overlying said rhodium and underlying the remainder of said resist coating.

14. A method of making a printed circuit board, comprising: applying a copper layer over an insulating base; electroplating a layer of nickel over said copper layer; electroplating a layer of rhodium over said nickel layer;

electroplating a layer of cadmium over the rhodium layer; coating said layer of cadmium with a photosensitive resist; said cadmium layer completely underlying said photosensitive resist and promoting the adherence thereof to the rhodium layer; exposing said photosensitive resist in accordance with the desired printed circuit pattern; removing the portions of said resist overlying the printed circuit portions desired to be removed; removing the cadmium layer and the underlying rhodium, nickel and copper layers exposed by the removal of the resist by subjecting the board to a chemical etchant for said metal layers; and removing the remainder of said resist coating and cadmium layer.

References Cited by the Examiner

UNITED STATES PATENTS

| | | | |
|---|---|---|---|
| 2,984,595 | 5/1961 | Schumpelt et al. | 204—15 |
| 3,013,956 | 12/1961 | Hugle et al. | 204—143 |

JOHN H. MACK, *Primary Examiner.*

JOSEPH REBOLD, *Examiner.*